(12) United States Patent  
Gambino et al.

(10) Patent No.: US 7,528,427 B2
(45) Date of Patent: May 5, 2009

(54) PIXEL SENSOR CELL HAVING ASYMMETRIC TRANSFER GATE WITH REDUCED PINNING LAYER BARRIER POTENTIAL

(75) Inventors: Jeffrey Gambino, Westford, VT (US); Mark Jaffe, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 11/668,555

(22) Filed: Jan. 30, 2007

(65) Prior Publication Data  
US 2008/0179639 A1 Jul. 31, 2008

(51) Int. Cl.  
*H01L 31/062* (2006.01)  
*H01L 27/148* (2006.01)

(52) U.S. Cl. .................. 257/292; 257/233
(58) Field of Classification Search .......... 257/231, 257/233, 290–292, 462, 464, 465, E27.131, 257/E27.133, E27.152  
See application file for complete search history.

(56) References Cited

U.S. PATENT DOCUMENTS

| | | | |
|---|---|---|---|
| 4,173,765 A | 11/1979 | Heald et al. |
| 4,760,273 A | 7/1988 | Kimata |
| 4,814,839 A | 3/1989 | Nishizawa et al. |
| 5,412,227 A | 5/1995 | Zommer |
| 5,503,017 A | 4/1996 | Mizukoshi |
| 5,811,336 A | 9/1998 | Kasia |
| 6,027,955 A | 2/2000 | Lee et al. |
| 6,127,697 A | 10/2000 | Guidash |
| 6,278,142 B1 | 8/2001 | Hynecek |
| 6,303,448 B1 | 10/2001 | Chang et al. |
| 6,465,820 B1 | 10/2002 | Fox |
| 6,531,380 B2 | 3/2003 | Li et al. |
| 6,660,553 B2 | 12/2003 | Kimura et al. |
| 6,713,796 B1 | 3/2004 | Fox |
| 6,744,084 B2 | 6/2004 | Fossum |
| 6,815,297 B1 | 11/2004 | Krivokapic et al. |
| 6,909,126 B1 | 6/2005 | Janesick |
| 7,205,591 B2 | 4/2007 | Adkisson et al. |
| 7,334,211 B1 | 2/2008 | Toros et al. |
| 7,378,697 B2 | 5/2008 | Rhodes |
| 7,387,908 B2 | 6/2008 | Patrick |
| 7,388,241 B2 | 6/2008 | Rhodes |
| 2001/0011736 A1 | 8/2001 | Dierickx |
| 2002/0088991 A1 | 7/2002 | Hisamoto |
| 2003/0075719 A1 | 4/2003 | Sriram |

(Continued)

FOREIGN PATENT DOCUMENTS

EP   0890993 A2   1/1999

OTHER PUBLICATIONS

Notice Of Allowance dated Jan. 10, 2007, U.S. Appl. No. 10/905,097.

(Continued)

*Primary Examiner*—Hung Vu  
(74) *Attorney, Agent, or Firm*—Anthony J. Canale

(57) ABSTRACT

A pixel sensor cell structure and method of manufacture. Disclosed is a pixel sensor cell comprising an asymmetric transfer gate for providing a pinning layer having an edge spaced a further distance from the gate channel region than an edge of a charge collection well. Potential barrier interference to charge transfer caused by the pinning layer is reduced.

13 Claims, 7 Drawing Sheets

U.S. PATENT DOCUMENTS

| | | |
|---|---|---|
| 2003/0089929 A1 | 5/2003 | Rhodes |
| 2003/0107066 A1 | 6/2003 | Stevenson et al. |
| 2003/0205741 A1 | 11/2003 | Rhodes |
| 2004/0000688 A1 | 1/2004 | Harari et al. |
| 2004/0075110 A1 | 4/2004 | Yaung et al. |
| 2004/0108502 A1 | 6/2004 | Nakamura et al. |
| 2004/0217436 A1 | 11/2004 | Kimura et al. |
| 2004/0253761 A1 | 12/2004 | Rhodes |
| 2004/0262609 A1 | 12/2004 | Mouli et al. |
| 2005/0001248 A1 | 1/2005 | Rhodes |
| 2005/0023553 A1 | 2/2005 | Rhodes |
| 2005/0042793 A1 | 2/2005 | Mouli et al. |
| 2005/0051701 A1 | 3/2005 | Hong |
| 2005/0051702 A1 | 3/2005 | Hong et al. |
| 2005/0098806 A1 | 5/2005 | Rhodes |
| 2005/0230721 A1 | 10/2005 | Patrick |
| 2005/0274874 A1 | 12/2005 | Nozaki et al. |
| 2006/0001060 A1 | 1/2006 | Rhodes |
| 2006/0011919 A1 | 1/2006 | Mouli |
| 2006/0118835 A1 | 6/2006 | Ellis-Monaghan et al. |
| 2006/0124976 A1 | 6/2006 | Adkisson et al. |
| 2006/0170009 A1 | 8/2006 | Kitano et al. |

OTHER PUBLICATIONS

"Elimination of Parasitic Currents in Transister-Schottky Barrier Diode Circuit" IBM Technical Disclosure Bulletin, vol. 19, No. 7, Dec. 1976, p. 2522.

Notice of Allowance dated Jul. 3, 2008, U.S. Appl. No. 11/681,454.

Notice of Allowance dated Dec. 14, 2006, U.S. Appl. No. 10/907,570.

US 7,528,427 B2

PIXEL SENSOR CELL HAVING ASYMMETRIC TRANSFER GATE WITH REDUCED PINNING LAYER BARRIER POTENTIAL

CROSS REFERENCE TO RELATED APPLICATIONS

The present invention is related to commonly-owned U.S. patent application Ser. No. 10/905,097 filed Dec. 15, 2004 and entitled "A RECESSED GATE FOR AN IMAGE SENSOR", and U.S. patent application Ser. No. 10/907,570 filed Apr. 6, 2005 and entitled "PIXEL SENSOR CELL HAVING REDUCED PINNING LAYER BARRIER POTENTIAL AND METHOD THEREOF", the whole contents and disclosures of which are incorporated by reference as if fully set forth herein.

FIELD OF THE INVENTION

The present invention relates generally to semiconductor devices and a method of forming semiconductor devices, and more particularly, to a semiconductor pixel sensor cell and method of forming the semiconductor pixel sensor cell.

BACKGROUND OF THE INVENTION

CMOS image sensors are beginning to replace conventional CCD sensors for applications requiring image pick-up such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption can be restrained lower than that of CCD sensors, and further, CMOS logic circuits and like logic processing devices are easily integrated in the sensor chip and therefore the CMOS image sensors can be miniaturized.

Current CMOS image sensors comprise an array of pixel sensor cells, which are used to collect light energy and convert it into readable electrical signals. Each pixel sensor cell comprises a photosensitive element, such as a photodiode, photo gate, or photoconductor overlying a doped region of a substrate for accumulating photo-generated charge in an underlying portion thereof. A read-out circuit is connected to each pixel cell and often includes a diffusion region for receiving charge from the photosensitive element, when read-out. Typically, this is accomplished by a transistor device having a gate electrically connected to the floating diffusion region. The imager may also include a transistor, having a transfer gate, for transferring charge from the photosensitive element to the floating diffusion region, and a transistor for resetting the floating diffusion region to a predetermined charge level prior to charge transfer.

As shown in FIG. 1, a conventional CMOS pixel sensor cell 10 includes a pinned photodiode 20 having a pinning layer 18 doped p-type and an underlying collection well 17 lightly doped n-type. Typically, pinned photodiode 20 is formed on top of a p-type substrate 15, or a p-type epitaxial layer or p-well surface layer, having a lower p-type concentration than pinning layer 18. N region 17 and p region 18 of photodiode 20 are typically spaced between an isolation region 19 and a charge transfer transistor gate 25 which is surrounded by thin spacer structures 23a,b. The photodiode 20 thus has two p-type regions 18 and 15 having a same potential so that the n region 17 is fully depleted at a pinning voltage (Vp). The pinned photodiode 20 is termed "pinned" because the potential in the photodiode 20 is pinned to a constant value, Vp, when the photodiode 20 is fully depleted. In operation, light coming from the pixel is focused down onto the photodiode and electrons collect at the n type region 17. When the transfer gate structure 25 is operated, i.e., turned on, the photo-generated charge 24 is transferred from the charge accumulating lightly doped n-type region 17 via a transfer device surface channel 16 to a floating diffusion region 30 which is doped n+ type.

A problem with these current CMOS imaging cells with a charge transfer gate 25 (e.g., a "4 Transistor" cell) is the definitional problem of controlling the readout of the charge. The p-type surface pinning layer 18 is necessary for low dark current, but can create a potential barrier between the n-type charge collection well 17 and the transfer device channel 16 resulting in "image lag". The structure as currently practiced by the industry is also very sensitive to normal manufacturing process variations. Overlay and image size variation of the block masks is critical for cell operation.

For example, in conventional processes for fabricating the pinning layer 18 and collection well 17 in the prior art pixel sensor cell 10 shown in FIG. 1, a problem is that an end portion of the pinning layer 18 and an end portion of the collection well 17 are formed substantially aligned to each other (i.e. identified in FIG. 1 by edge 50) and somewhat overlap the transfer gate structure 25. The pinning layer 18 creates a relatively large potential barrier to charge transfer between the collection well 17 and the transfer device channel 16.

Structures and methods that minimize the potential barrier created by the pinning layer and the parametric variability of the transfer gate are of great value for image sensors.

It would thus be highly desirable to provide a novel pixel sensor cell and method of manufacture whereby a potential barrier between the charge collection well and the transfer gate channel is reduced without adversely affecting the performance of the photodiode and the transfer gate.

SUMMARY OF THE INVENTION

The invention addresses a novel pixel sensor cell structure and method of manufacture. Particularly, a novel pixel sensor cell is fabricated whereby a potential barrier between the charge collection well and the transfer gate channel is reduced without adversely affecting the performance of the photodiode and the transfer gate.

According to a first aspect of the invention, there is provided a pixel sensor cell comprising an asymmetric transfer gate formed on a substrate. A photosensitive region (e.g. photodiode) is formed adjacent a first side of the asymmetric transfer gate including a charge collection well having an edge substantially defined by a first feature of the asymmetric transfer gate and a pinning layer having an edge substantially defined by a second feature of the asymmetric transfer gate. The edge of the pinning layer is spaced a distance further away from a channel region of the asymmetric transfer gate than the edge of the collection well region. This improves the control of the readout of the charge of the pixel sensor cell as the ability of the pinning layer to produce a potential barrier to charge transfer is reduced without adversely affecting the performance of the photodiode and the transfer gate.

According to a second aspect of the invention, there is provided a method of forming a pixel sensor cell comprising the steps of: providing a substrate; forming an asymmetric transfer gate on the substrate; and forming a photosensitive region adjacent a first side of the asymmetric transfer gate comprising the steps of: (i) forming a charge collection well having an edge substantially defined by a first feature of the asymmetric transfer gate; and (ii) forming a pinning layer having an edge substantially defined by a second feature of the asymmetric transfer gate, the edge of the pinning layer spaced a distance further away from a channel region of the asymmetric transfer gate than the edge of the collection well region.

BRIEF DESCRIPTION OF THE DRAWINGS

The aspects, features and advantages of the present invention will become apparent to one skilled in the art, in view of the following detailed description taken in combination with the attached drawings, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF PREFERRED EMBODIMENTS

Embodiments of the invention are described herein below in terms of a "pixel sensor cell". It is noted that the term "pixel sensor cell" is used to generally refer to any type of sensor cell which is capable of converting incident electromagnetic radiation into an electrical signal. An example of a pixel sensor cell according to the invention includes a pixel sensor cell that is capable of detecting optical wavelengths of electromagnetic radiation and is commonly referred to as an "image sensor". An image sensor fabricated using CMOS technology is commonly referred to as a "CMOS image sensor".

Figure 1:
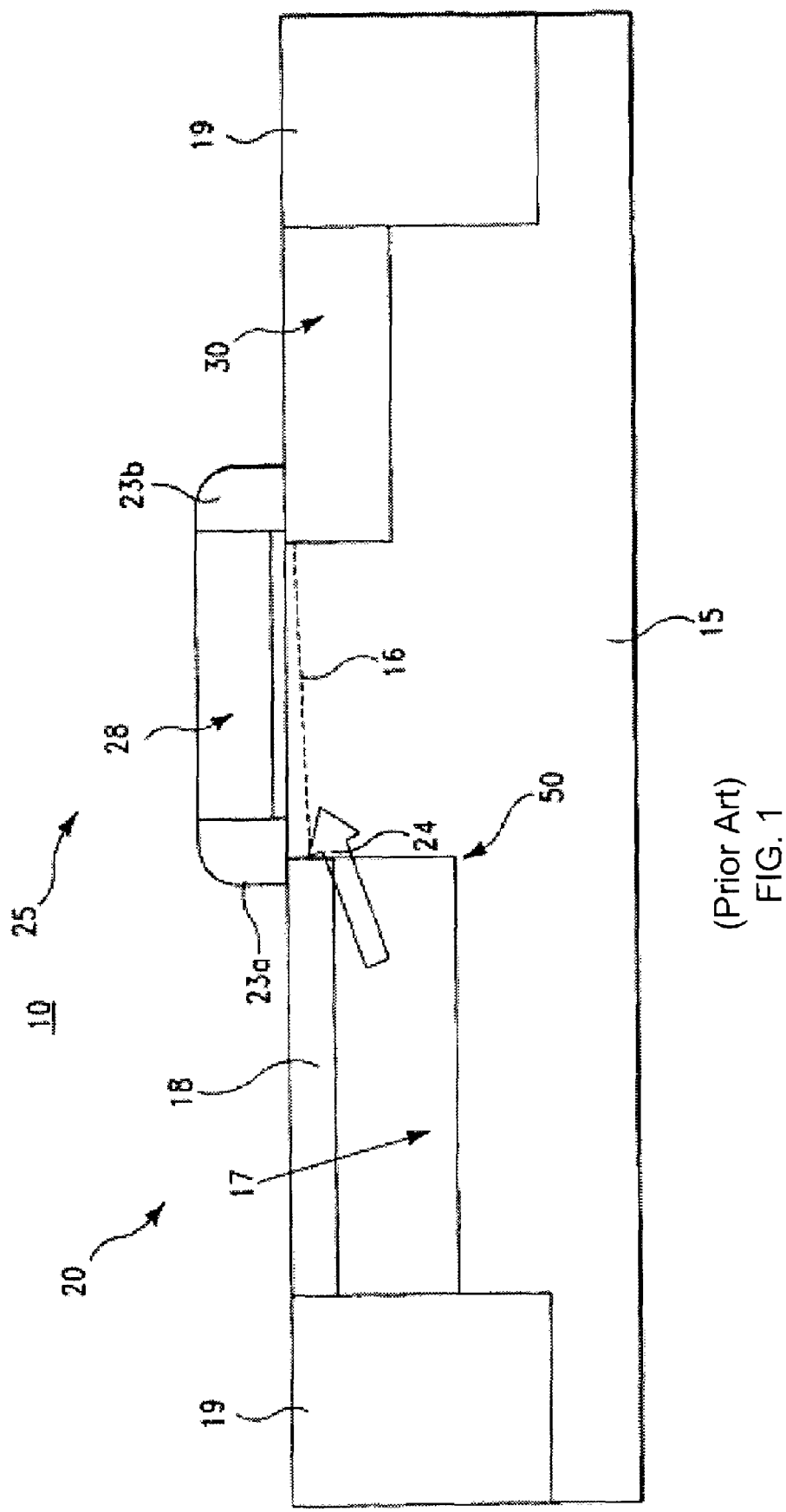
FIG. 1 depicts a CMOS image sensor pixel array 10 according to the prior art.
Figure 2:
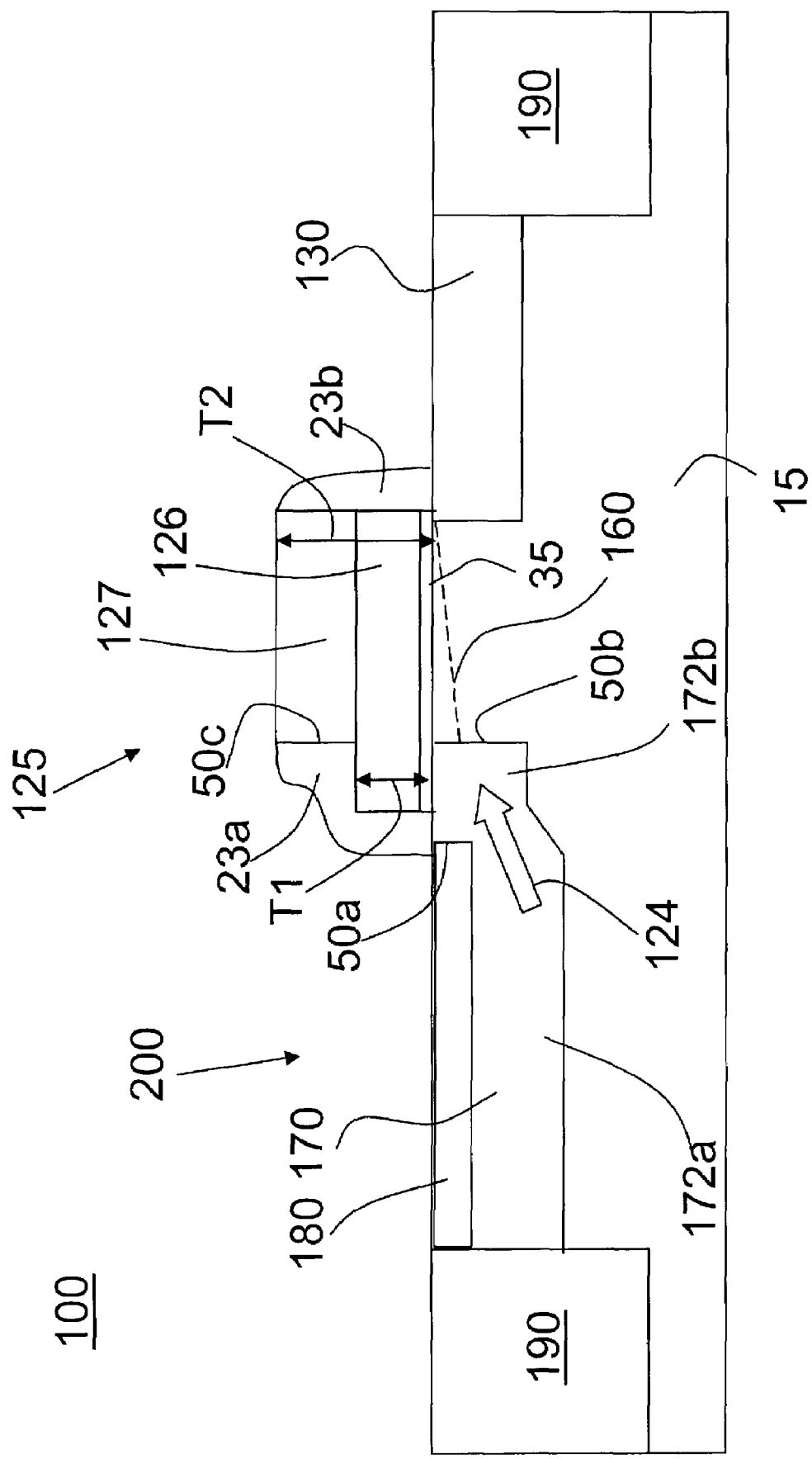
FIG. 2 illustrates a pixel sensor cell 100 of the present invention.

FIG. 2 illustrates a pixel sensor cell 100 according to an embodiment of the present invention. As shown in FIG. 2, pixel sensor cell 100 includes a transfer gate 125 on top of a gate dielectric material layer 35 which is formed on a surface of a semiconductor substrate 15. Gate sidewall spacer 23a, 23b is formed adjacent to sides of transfer gate 125. Between one side of transfer gate 125 and isolation region 190 is a photodiode 200 comprising a surface pinning layer 180 doped with material of a first conductivity, e.g., p type material dopant, and a charge collection well region 170 doped with material of a second conductivity, e.g., n type material dopant, formed directly underneath pinning layer 180. Abutting the other side of transfer gate 125 is a gate diffusion region 130 (also referred to as a "floating diffusion") doped with material of a second conductivity, e.g., n type material dopant.

As shown in FIG. 2, transfer gate channel region 160 is formed in a region under transfer gate 125. In a cross-sectional view taken through the width of transfer gate 125, transfer gate 125 has an asymmetric shape resembling "an inverse partial-T" or "a reverse-L" shape with a portion of transfer gate 125 adjacent to photodiode 200 having a thickness T1 which is less than a thickness T2 of another portion of the transfer gate 125. In an embodiment of the invention, asymmetric transfer gate 125 includes a multi-layer gate conductor such as, for example, a gate conductor 126 on gate dielectric layer 35 and a gate conductor 127 on at least a portion of gate conductor 126 as shown in FIG. 2. Likewise, a single layer gate conductor could be used and a portion removed to form portions having thicknesses of T1 and T2. For the case when the thickness of gate dielectric layer 35 is relatively small when compared to the thicknesses of gate conductors 126 and 127, the thickness T1 of the portion of the transfer gate 125 adjacent to the photodiode 200 is provided by the thickness of gate conductor 126 while the total thickness of gate conductors 126 and 127 provides the thickness T2 of the other portion of the transfer gate 125. As will be described herein below, asymmetric transfer gate 125 can be used to form charge collection well region 170 and pinning layer 180 having certain attributes such as, for example, an edge 50a of the pinning layer 180 is spaced a further distance from the transfer gate channel region 160 than an edge 50b of the charge collection well region 170. Also, charge collection well region 170 has a portion 172a formed under pinning layer 180 and a portion 172b formed substantially under the portion of transfer gate 125 having a thickness T1. Portion 172a has a depth which extends deeper than a depth of portion 172b to form a material dopant concentration gradient ("graded" region) between portions 172a and 172b. The overlap of portion 172b and portion T1 of transfer gate 125 affects properties of pixel sensor cell 100, such as image lag and dark current. As the overlap increases, image lag is reduced but dark current increases. Hence, based on factors such as the design of the pixel sensor cell 100, the overlap between portion 172b and portion T1 of transfer gate 125 is selected to achieve acceptable values for both image lag and dark current.

The difference in alignment of edges 50a and 50b helps overcome the limitations of the prior art pixel sensor cell structure since pinning layer 180 no longer intersects the path of charge transfer 124, thus, potential barrier interference from pinning layer 180 is reduced. Portion 172b of charge collection well 170 intersects transfer gate channel 160 which further improves charge transfer from charge collection well 170 to transfer gate channel 160. The material dopant concentration gradient formed in charge collection well 170 also assists in transferring generated carriers toward transfer gate channel 160. Portion 172b is self-aligned to a feature (e.g. edge 50c) of transfer gate 125 rather than a photoresist mask which improves process control, thus, reducing the variation in image lag and dark current between pixel sensor cells produced on the same substrate.

Figure 3A:
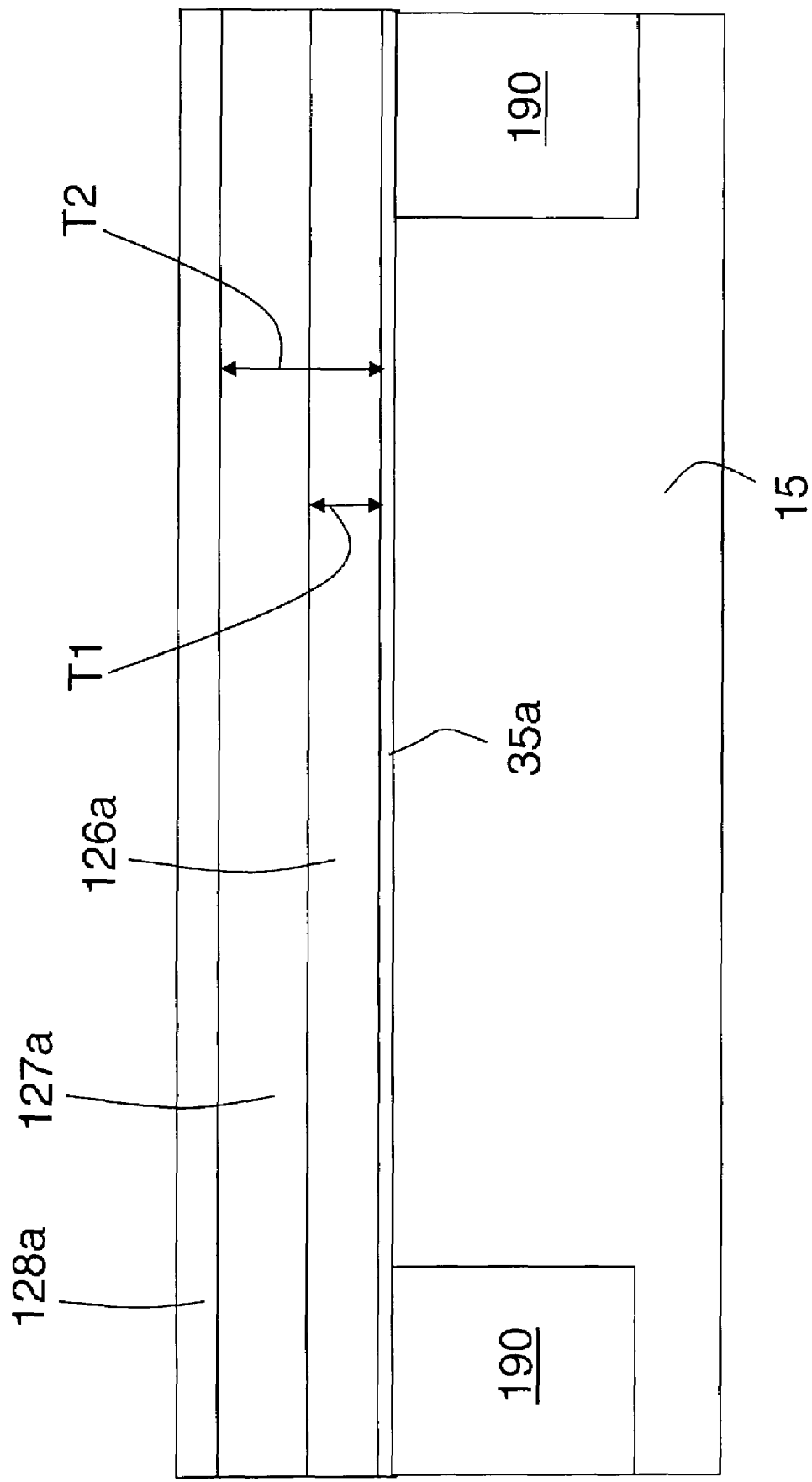
FIGS. 3A-E depict, through cross-sectional views, process steps according to an embodiment of the present invention for forming the pixel sensor cell 100 and resulting in the structure shown in FIG. 2.

A method to fabricate a pixel sensor cell according to an embodiment of the invention will be described with reference to FIGS. 3A-3E. As shown in FIG. 3A, there is provided a substrate 15 which may be a bulk semiconductor including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). For purposes of description, substrate 15 is a Si-containing semiconductor substrate of a first conductivity type, e.g., lightly doped with p-type dopant material such as boron or indium (beryllium or magnesium for a III-V semiconductor), to a standard concentration ranging between, e.g., $1 \times 10^{14}$ to $1 \times 10^{16}$ atoms per $cm^3$. Isolation regions 190, e.g., STI region, are formed on substrate 15 using conventional processes. Next, transfer gate structure 125 shown in FIG. 2 is formed using standard processing techniques known in the art. For example, a dielectric layer 35a is formed by standard deposition or growth techniques atop substrate 15 that will form the eventual transfer gate dielectric 35. Dielectric layer 35a is typically formed to a thickness ranging between 35 Angstroms (Å) to 100 Å and may comprise suitable gate dielectric materials including but not limited to: an oxide (e.g., $SiO_2$), a nitride (e.g., silicon nitride) an oxynitride (e.g., Si oxynitride), $HfO_2$, $ZrO_2$, or other like materials. Dielectric layer 35a is formed on the surface of the Si-containing semiconductor substrate 15 using conventional thermal oxidation or by a suitable deposition process such as chemical vapor deposition, plasma-assisted chemical vapor deposition, evaporation, sputtering and other like deposition processes. Although it is not shown, it is understood that dielectric layer 35a may comprise a stack of dielectric materials.

Next, first gate layer 126a and second gate layer 127a are formed over dielectric layer 35a using conventional deposition processes including, but not limited to: CVD, plasma-assisted CVD, sputtering, plating, evaporation and other like deposition processes (e.g., a low pressure CVD). According to an embodiment of the invention, materials used for first gate layer 126a and second gate layer 127a are selected such that second gate layer 127a has a higher removal rate than first gate layer 126a when exposed to a removal process (e.g. reactive ion etch). For example, first gate layer 126a may be comprised of polysilicon while second gate layer 127a may be comprised of polysilicon germanium (poly-SiGe). For purposes of description, polysilicon gate layer 126a is formed atop dielectric layer 35a having a thickness T1 of about 0.5 kÅ to about 5 kÅ, and poly-SiGe gate layer 127a is formed atop polysilicon layer 126a having a thickness of about 0.5 kÅ to about 5 kÅ. The addition of the individual thicknesses of polysilicon gate layer 126a and poly-SiGe gate layer 127a provides the total thickness T2 of gate structure 125. It is understood that for proper operation, polysilicon gate layer 126a and poly-SiGe gate layer 127a must be doped with the second conductivity type, e.g. n-type, to a concentration in the range of about $1\times10^{18}$ atoms per $cm^3$ to about $1\times10^{19}$ atoms per $cm^3$. This may be accomplished by the standard practice of utilizing the source/drain implants or by predoping before etch, or by using insitu doped polysilicon or poly-SiGe. Hard mask layer 128a (e.g. silicon oxide or silicon nitride) having a thickness of about 0.2 kÅ to about 2 kÅ is formed on second gate layer 127a by a conventional deposition process. As will be described herein below, a portion of hard mask layer 128a will be involved in the patterning of first gate layer 126a and second gate layer 127a.

Other materials can be used for first and second gate layers such as, for example, polysilicon for first gate layer 126a and poly germanium (poly Ge) for second gate layer 127a; or, un-doped polysilicon for first gate layer 126a and in-situ doped polysilicon for second gate layer 127a. In another embodiment of the invention, two similar materials (e.g. un-doped polysilicon) can be used for the first and second gate layers, respectively, with an etch stop layer (e.g. tungsten silicide) located between the layers. In yet another embodiment of the invention, a single layer of material can be patterned and a portion removed to form T1 and T2 portions of transfer gate 125.

Figure 3B:
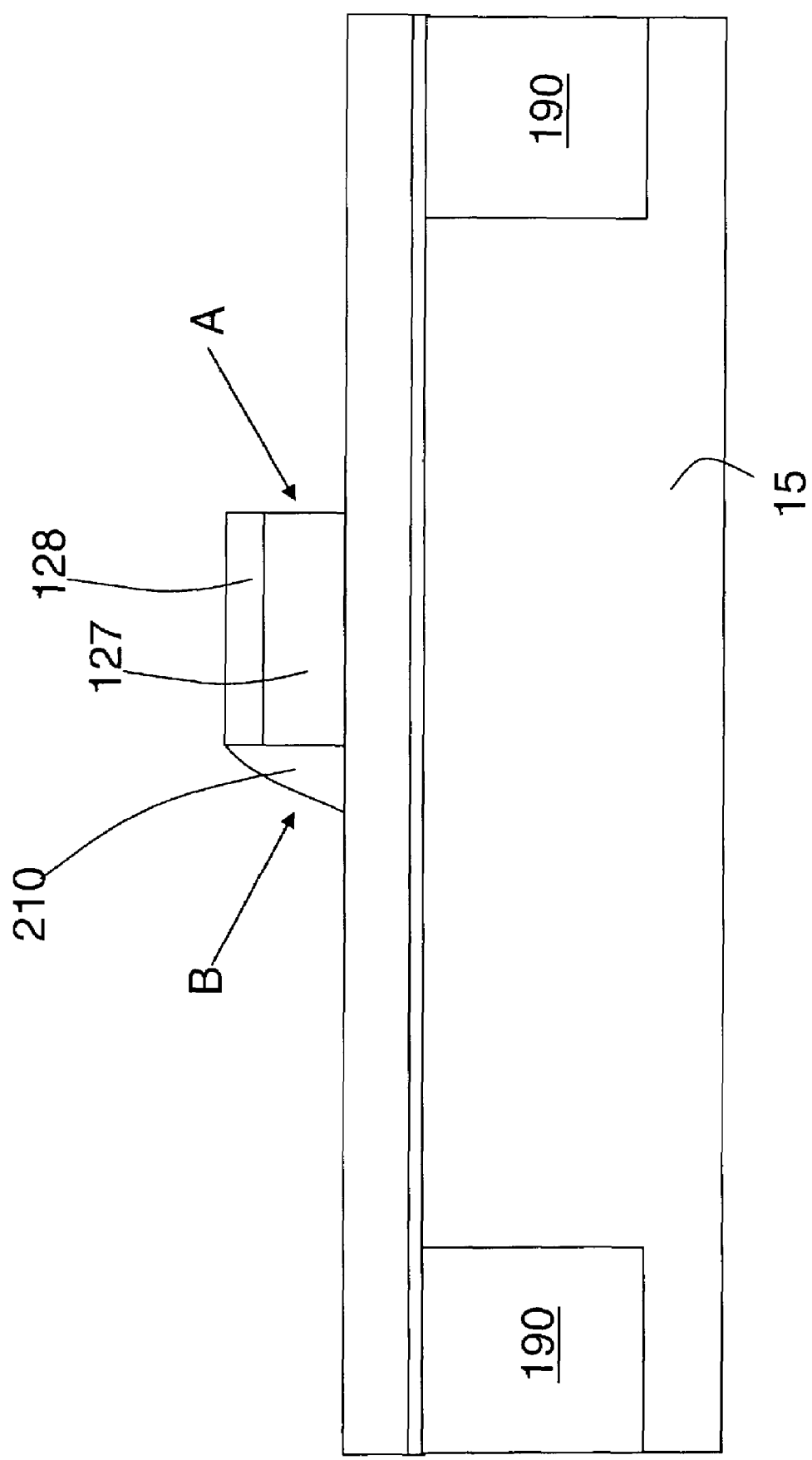

Referring to FIG. 3B, a mask (not shown) such as, for example, a photo-resist mask is formed on hard mask layer 128a. Exposed portions of hard mask layer 128a and poly-SiGe gate layer 127a are removed by an etch process (e.g. a chlorine-based reactive ion etch process) to form hard mask 128 and gate conductor 127. The photo-resist mask can be removed after etching both exposed portions of hard mask layer 128a and poly-SiGe gate layer 127a, or, alternatively, the photo-resist mask can be removed after etching exposed portions of hard mask layer 128a and then using hard mask 128 to pattern poly-SiGe gate layer 127a. Next, spacer 210 is formed on sidewalls of gate conductor 127 by conventional deposition and etch processes known in the art and spacer 210 can be referred to as a "sacrificial spacer" or "disposable spacer" since it will be eventually removed as described herein below. Spacer 210 may comprise any conventional oxide or nitride or oxide/nitride. Typically spacer 210 has a thickness of from about 50 nanometers (nm) to about 500 nm. Preferably, spacer 210 comprises oxide while hard mask 128 comprises nitride. Oxide spacer 210 formed on side "A" of poly-SiGe gate conductor 127 is then removed from side "A" using conventional mask and etch processes (not shown) such as, for example, forming a photo-resist mask such that spacer 210 formed on side "A" is exposed while spacer 210 formed on side "B" is covered by the photo-resist mask; and removing exposed spacer 210 from side "A" (e.g. an HF wet etch can be used to remove an oxide spacer) while spacer 210 on side "B" and nitride hard mask 128 remain substantially in place and are not removed.

Figure 3C:
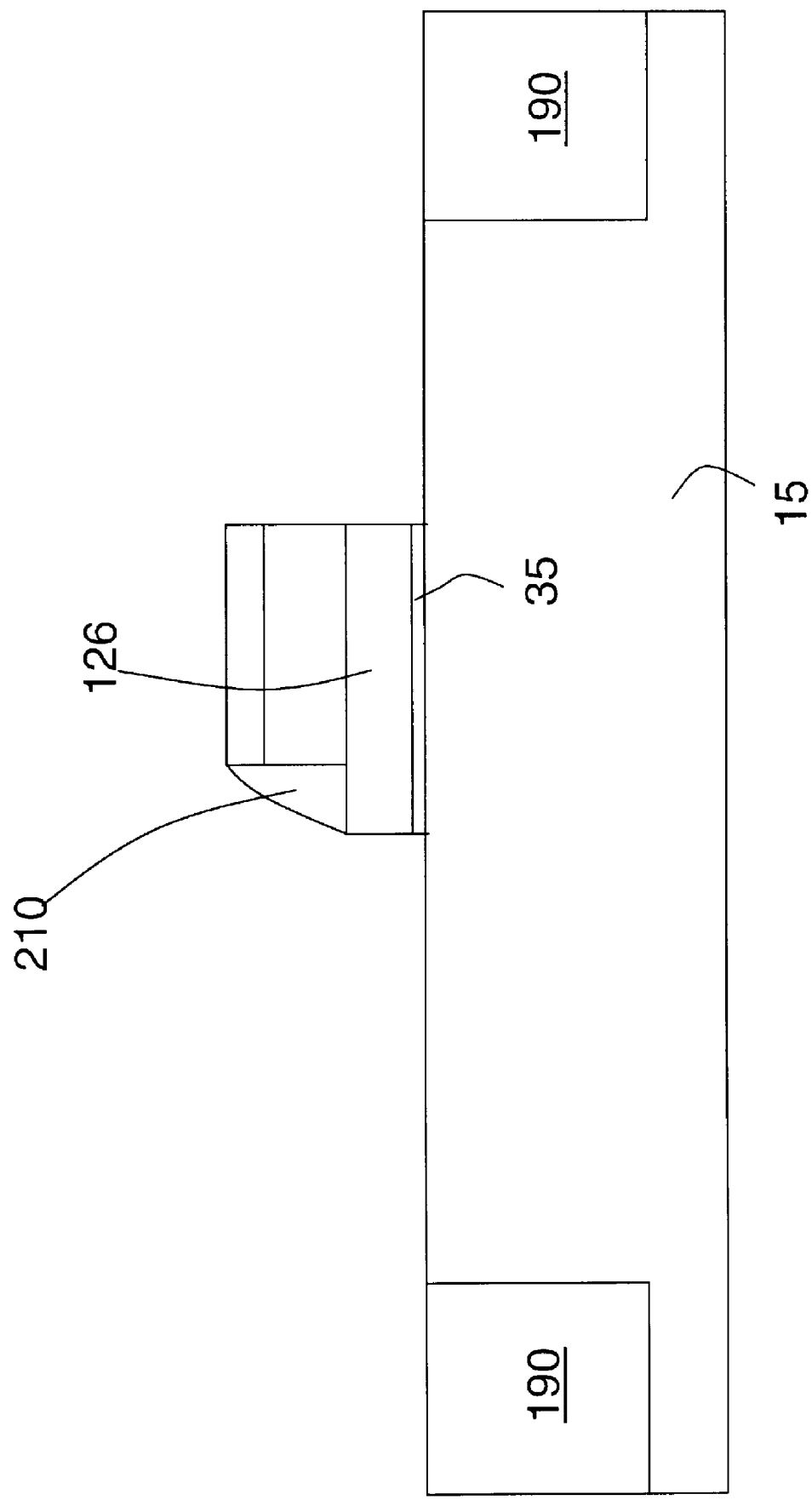

Remaining oxide spacer 210 and nitride hard mask 128 are used as a "mask" to define the transfer gate dielectric 35 and polysilicon gate conductor 126 as shown in FIG. 3C. Exposed portions of polysilicon gate layer 126a are removed using one or more etch processes, e.g., a chlorine-based reactive ion etch process, that is optimized to ensure proper etching of the polysilicon gate layer 126a and dielectric layer 35a (or dielectric layer stack). Hard mask 128 prevents etching of the upper surface of poly-SiGe gate conductor 127 during the etching of exposed portions of polysilicon gate layer 126a and dielectric layer 35a.

Figure 3D:
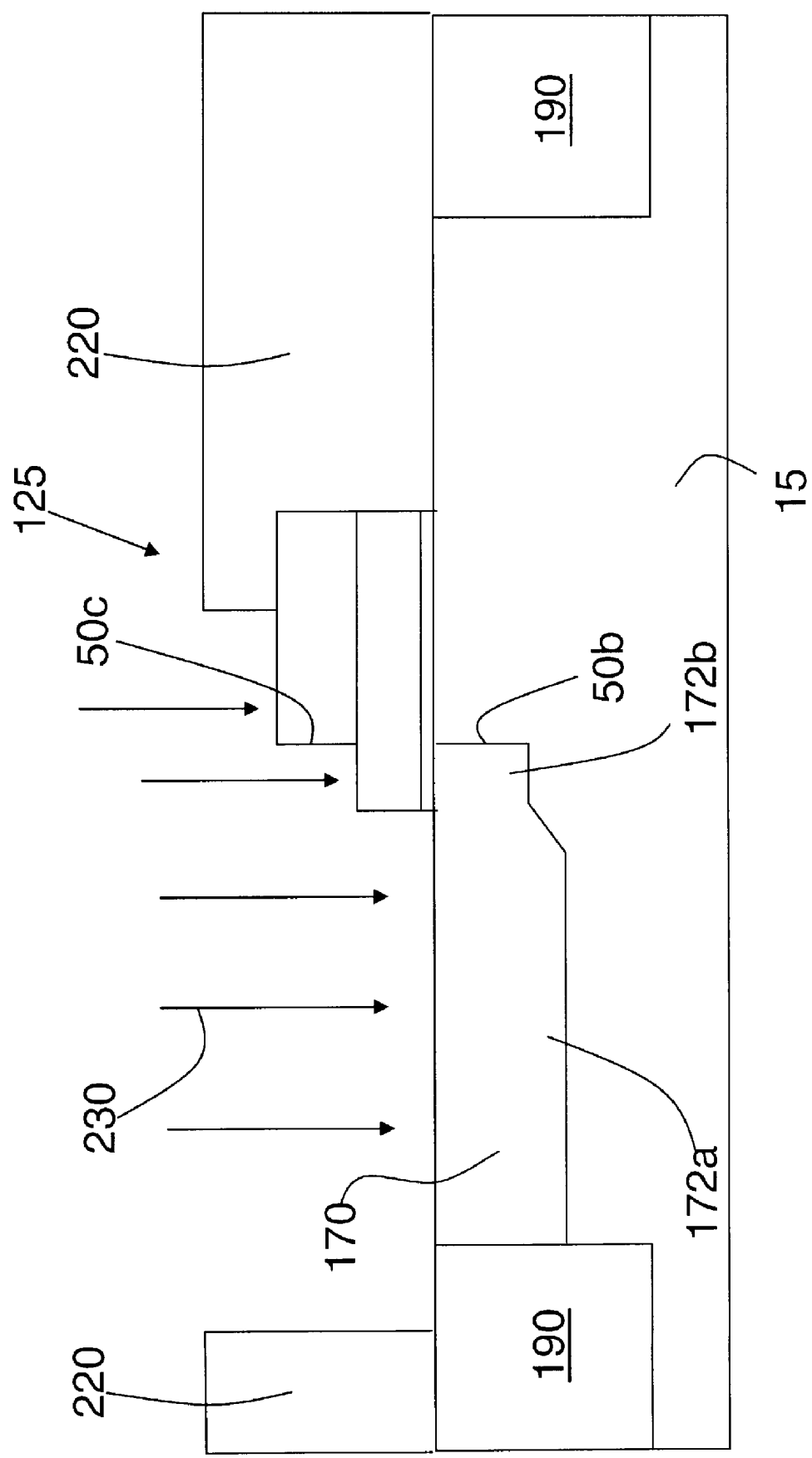

Referring to FIG. 3D, disposable oxide spacer 210 and nitride hard mask 128 are removed by conventional processes. For example, oxide spacer 210 can be removed using a hydrofluoric (HF) acid wet etch and nitride hard mask 128 can be removed using a hydrofluoric acid/ethylene glycol (HF/EG) etch or a phosphoric acid ($H_3PO_4$) etch. Next, a photoresist layer is formed on substrate 15 and is patterned to form ion implantation mask 220 according to techniques known in the art to provide an opening in a region between an edge of transfer gate 125 and isolation region 190, e.g., STI region, where the charge accumulation region of photodiode 200 is to be formed.

Using ion implantation mask 220, an ion implantation process 230 (e.g. vertical ion implant) is performed to implant dopant material of the second conductivity type, e.g., n-type, dopant material, such as phosphorus, arsenic or antimony, to form the charge collection well 170. The active n-type dopant material is ion implanted at dosing concentrations ranging between about $1\times10^{16}$ atoms per $cm^3$ and about $1\times10^{18}$ atoms per $cm^3$.

In the region of photodiode 200 between transfer gate 125 and isolation region 190, ion implant 230 is substantially unobstructed from entering substrate 15 which results in n-type dopant material forming portion 172a of charge collection well 170. Ion implant 230 which is incident on the portion of transfer gate 125 having a thickness T1 penetrates this portion of the transfer gate 125 which results in n-type dopant material forming portion 172b of charge collection well 170 substantially under the portion of transfer gate 125 having a thickness T1. Since the thickness T1 of transfer gate 125 is sufficient to prevent some of ion implant 230 from penetrating into substrate 15, portion 172a has a depth which extends deeper than a depth of portion 172b which results in a material dopant concentration gradient ("graded" region) between portions 172a and 172b. Also, it is noted that transfer gate 125 provides for a well controlled placement of edge 50b of charge collection well 170 since edge 50b is substantially aligned with edge 50c of transfer gate 125. Alignment of edge 50b with edge 50c ensures that portion 172b of charge collection well 170 intersects transfer gate channel 160. Ion implant 230 which is incident on the portion of transfer gate 125 having a thickness T2 is blocked by this thicker portion of transfer gate 125 so substantially no n-type dopant material penetrates into substrate 15.

Although an embodiment of the invention has been described with reference to FIG. 3D using a vertical ion implant 230 to form charge collection well 170, charge collection well 170 may be formed, for example, by an angled ion implant or by a combination of vertical and angled ion implants to tailor the profile of the charge collection well 170. For example, charge collection well 170 can be formed by a vertical ion implant performed substantially normal (i.e. 90 degrees) to an upper surface of the substrate 15 and an angled ion implant performed at an angle of about 1 degree to about 15 degrees to the upper surface of the substrate 15. The angled implant allows more dopant material to be distributed into portion 172b of a pixel cell for a pixel cell array layout where the transfer gate orientation is identical for all pixel cells in the array. An advantage of the present invention is that a relatively large amount of dopant material can be introduced into portion 172b of pixel cells in a pixel cell array without the need to use an angled ion implant, thus, the present invention is independent of the orientation of the transfer gates of pixel cells in a pixel cell array.

Figure 3E:
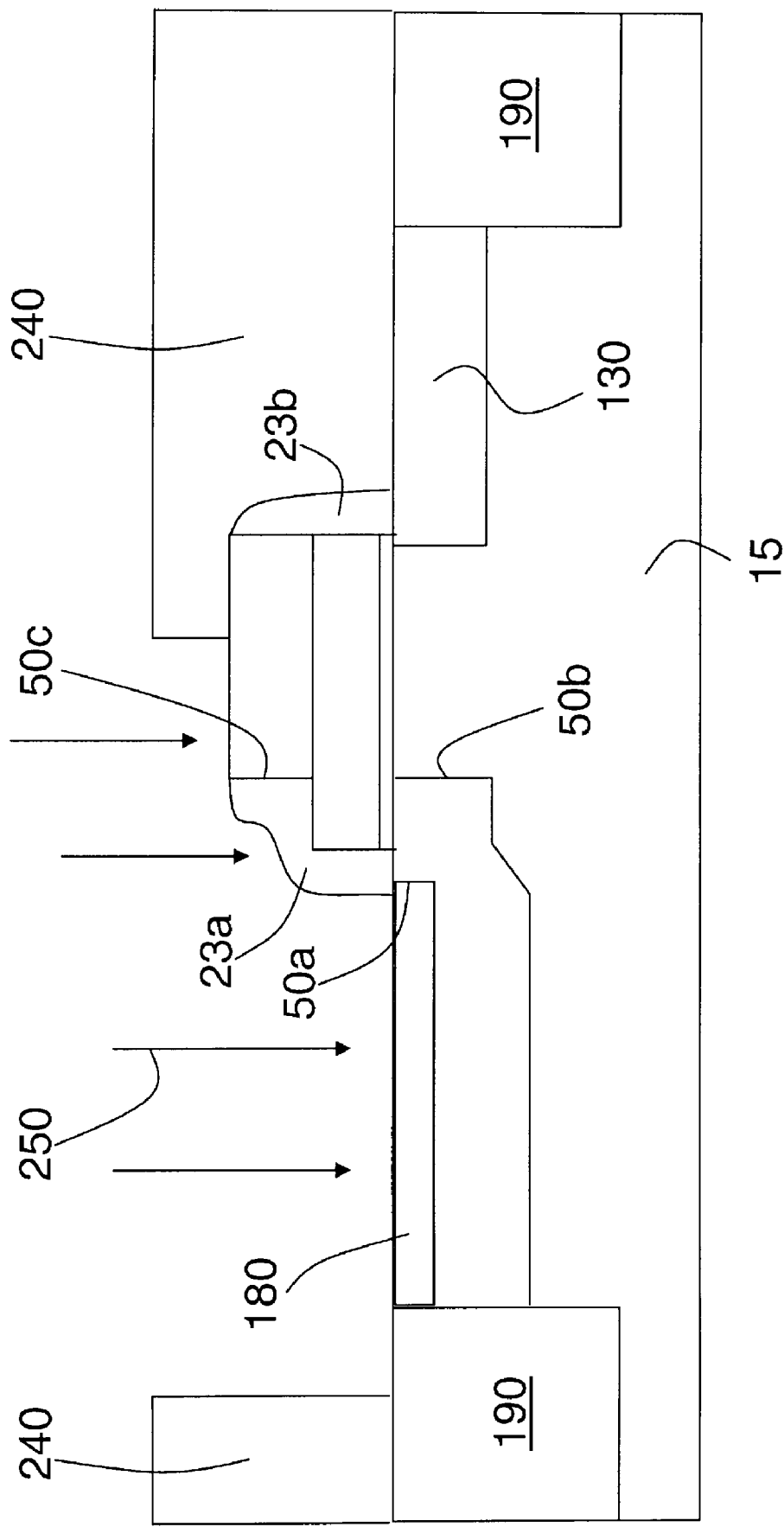

Referring to FIG. 3E, ion implantation mask 220 is removed using a conventional photoresist removal process (not shown) such as, for example, an ozone strip. In a further step (not shown), a gate sidewall spacer (denoted as 23a, 23b in FIG. 3E) is formed at either side of the transfer gate 125 by conventional deposition and etch processes known in the art. Spacer 23a, b may comprise any conventional oxide, nitride (e.g., $Si_3N_4$) or oxide/nitride. The thickness of spacer 23a,b may vary, but typically spacer 23a, b has a thickness of from about 10 nm to about 150 nm.

An n-type gate diffusion region 130 at one side of transfer gate structure 125 is then formed. This step (not shown) comprises forming a photoresist layer and patterning an ion implantation mask according to techniques known in the art to form a mask edge approximately coincident with the transfer gate edge or as close as possible given alignment tolerances, to provide an opening allowing the implantation of n-type dopant material, such as phosphorus, arsenic or antimony, at a concentration sufficient to form the n+-type gate diffusion region 130 up to the edge of the spacer 23b as shown in FIG. 3E. The active n+-type dopant material is ion implanted at the gate diffusion region 130 at dosing concentrations ranging between about $1\times10^{18}$ atoms per $cm^3$ and about $1\times10^{20}$ atoms per $cm^3$. It is noted that gate diffusion region 130 can be formed at other points in the process, for example, after formation of pinning layer 180 of photodiode 200 (described herein below).

Next, the ion implantation mask used to form gate diffusion region 130 is removed and another photoresist layer is formed on substrate 15 and is patterned to form ion implantation mask 240 according to techniques known in the art to provide an opening in the region of photodiode 200 between transfer gate 125 and isolation region 190. This opening permits ion implantation 250 (e.g. vertical ion implant) of p-type dopant material such as boron at a concentration sufficient to form p-type pinning layer 180 as shown in FIG. 3E. The active p-type dopant material is ion implanted at dosing concentrations ranging between about $1\times10^{17}$ atoms per $cm^3$ and about $1\times10^{19}$ atoms per $cm^3$. Transfer gate 125 (including spacer 23a) prevents ion implant 250 from forming under transfer gate 125 since the thicknesses T1 and T2 of transfer gate 125 are sufficient to block ion implant 250 which is incident upon transfer gate 125. Thus, edge 50a of pinning layer 180 is substantially defined by spacer 23a and, as such, edge 50a of pinning layer 180 is offset from edge 50b of charge collection well 170. As described herein above with reference to FIG. 2, the offset between edge 50a and edge 50b results in pinning layer 180 no longer intersecting the path of charge transfer 124, thus, potential barrier interference from pinning layer 180 is reduced. Transfer gate 125 provides for a well controlled offset between edge 50b of charge collection well 170 and edge 50a of pinning layer 180 since edge 50b is substantially aligned with edge 50c of transfer gate 125 while edge 50a is substantially aligned with an edge of spacer 23a.

It should be understood that, alternatively, pinning layer 180 may be formed by other known techniques. For example, pinning layer 180 may be formed by a gas source plasma doping process, or by diffusing a p-type dopant from an in-situ doped layer or a doped oxide layer deposited over the area where photodiode 200 is to be formed.

It should also be understood that other features of a pixel sensor cell could be included in the pixel sensor cell of the present invention but have been omitted from the description above for sake of clarity. For example, an extension implant region could be formed in gate diffusion region 130, and/or a silicide (e.g. cobalt silicide) could be formed on a surface of gate diffusion region 130 using conventional processes.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be construed to cover all modifications that may fall within the scope of the appended claims.

Having thus described our invention, what we claim as new, and desire to secure by Letters Patent is:

1. A pixel sensor cell comprising:
a substrate;
an asymmetric transfer gate formed on said substrate, said asymmetric transfer gate comprising:
a first portion; and
a second portion adjacent to said first portion, said second portion having an edge offset from an edge of said first portion;
a photosensitive region adjacent a first side of said asymmetric transfer gate comprising:
a charge collection well having an edge substantially defined by said edge of said first portion of said asymmetric transfer gate; and
a pinning layer having an edge substantially defined by said edge of said second portion of said asymmetric transfer gate, said edge of said pinning layer spaced a distance further away from a channel region of said asymmetric transfer gate than said edge of said collection well region.

2. The pixel sensor cell of claim 1, wherein said first portion of said asymmetric transfer gate comprises a thickness T2 and said second portion of said asymmetric transfer gate comprises a thickness T1 less than said thickness T2.

3. The pixel sensor cell of claim 1, wherein said second portion of said asymmetric transfer gate is located adjacent to said photosensitive region.

4. The pixel sensor cell of claim 1, wherein said edge of said pinning layer is substantially aligned with an edge of a spacer formed adjacent to said second portion of said asymmetric transfer gate.

5. The pixel sensor cell of claim 1, wherein said asymmetric transfer gate has an inverse partial-T shape or reverse L shape.

6. The pixel sensor cell of claim 1 further comprising a gate diffusion region adjacent to a second side of said asymmetric transfer gate.

7. The pixel sensor cell of claim 1, wherein said asymmetric transfer gate comprises at least two gate conductor layers.

8. The pixel sensor cell of claim 1, wherein said first portion of said asymmetric transfer gate comprises a material substantially the same as that of said second portion of said asymmetric transfer gate.

9. The pixel sensor cell of claim 1, wherein said first portion of said asymmetric transfer gate comprises a material different than that of said second portion of said asymmetric transfer gate.

10. The pixel sensor cell of claim 9, wherein said first portion comprises polysilicon germanium, and said second portion comprises polysilicon.

11. A CMOS image sensor including an array of pixels, at least one pixel including a pixel sensor cell structure comprising:

a substrate;

a gate structure formed on the substrate, said gate structure having a first portion and a second portion having an edge different than an edge of said first portion;

a first doped region of a first conductivity type formed beneath a surface of said substrate having an edge substantially aligned with said edge of said second portion of said gate structure; and a second doped region of a second, opposite conductivity type formed atop said first doped region at a surface of said substrate having an edge defined by said edge of said first portion of said gate structure, said edge of said second doped region spaced a distance further away from a channel region of said gate structure than said edge of said first doped region.

12. The CMOS image sensor of claim 11, wherein said first doped region forms a charge collection well and said second doped region forms a pinning layer of a photodiode.

13. The CMOS image sensor of claim 11, wherein said first portion has a substantially uniform thickness T1 and said second portion has a substantially uniform thickness T2 greater than T1.

* * * * *